(12) United States Patent
Lee et al.

(10) Patent No.: US 8,476,003 B2
(45) Date of Patent: Jul. 2, 2013

(54) ITERATIVE RINSE FOR SEMICONDUCTOR FABRICATION

(75) Inventors: Yung-Yao Lee, Zhubei (TW);
Wei-Hong Chuang, Zhubei (TW);
Li-Shiuan Chen, Kaohsiung (TW);
Ping-Hsi Yang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 13/044,277

(22) Filed: Mar. 9, 2011

(65) Prior Publication Data
US 2012/0231395 A1 Sep. 13, 2012

(51) Int. Cl.
*G03F 7/26* (2006.01)
(52) U.S. Cl.
USPC .......................................... 430/331; 430/311
(58) Field of Classification Search
USPC ................................................ 430/311, 331
See application file for complete search history.

(56) References Cited

U.S. PATENT DOCUMENTS

| 5,175,124 A | 12/1992 | Winebarger |
| 2003/0137065 A1* | 7/2003 | Medower et al. ............ 264/1.33 |
| 2006/0115774 A1* | 6/2006 | Wang et al. ................... 430/331 |
| 2011/0134716 A1* | 6/2011 | Seiwert et al. ............... 366/101 |

OTHER PUBLICATIONS

Ming-Hsi Yeh, Yu-Fu Lin, Shao-Yen Ku, Chi-Ming Yang and Chin-Hsiang Lin; "Cleaning Process for Semiconductor Device Fabrication;" U.S. Appl. No. 13/022,931; 15 Pages, filed Feb. 8, 2011.

* cited by examiner

*Primary Examiner* — Kathleen Duda
(74) *Attorney, Agent, or Firm* — Haynes and Boone, LLP

(57) ABSTRACT

An iterative rinse for fabrication of semiconductor devices is described. The iterative rinse includes a plurality of rinse cycles, wherein each of the plurality of rinse cycles has a different resistivity. The plurality of rinse cycles may include a first rinse of a semiconductor substrate with de-ionized (DI) water and carbon dioxide ($CO_2$), followed by a second rinse the semiconductor substrate with DI water and $CO_2$. The first rinse has a first resistivity; the second rinse has a second resistivity lower than the first resistivity.

19 Claims, 4 Drawing Sheets

ITERATIVE RINSE FOR SEMICONDUCTOR FABRICATION

BACKGROUND

The semiconductor integrated circuit (IC) industry has experienced rapid growth. Technological advances in IC materials and design have produced generations of ICs where each new generation has smaller and more complex circuits that the previous generation. However, these advances have increased the complexity of the semiconductor fabrication process(es). For these advances to be realized, similar developments in manufacturing processes are needed. As features are scaled down from one generation to the next, solutions for reducing defects become more critical. One especially critical fabrication process is the formation of the gate dielectric.

Current rinse technologies experience a trade-off between controlling defect types. For example, rinse technologies which control (e.g., reduce) damage to the semiconductor device often experience an increase in other types of defects, such as, for example, remaining photoresist residue on the device.

Thus, what is needed is an improved rinse process for semiconductor device fabrication.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. Additionally, the present disclosure is directed, at times, to semiconductor device or integrated circuit device manufacturing. However, one would recognize the benefits of the present disclosure can be applied in other device technologies, such as liquid crystal display (LCD) and/or any other technology which may benefit from the rinse processes described herein.

Figure 1:
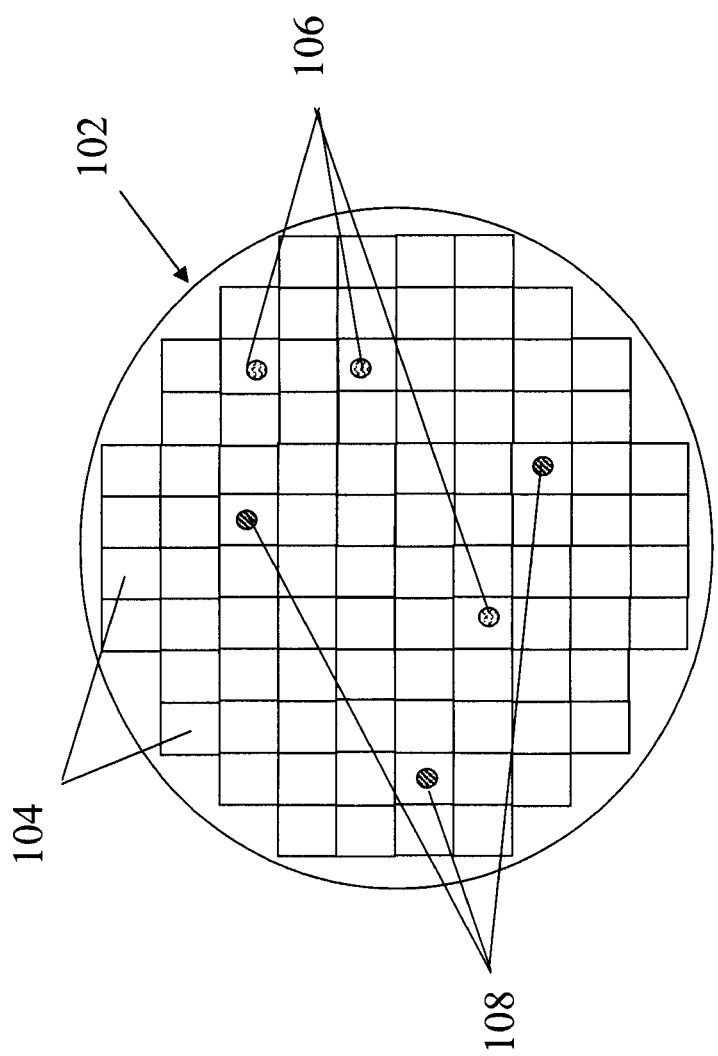
FIG. 1 is top view illustrating an embodiment of a semiconductor substrate.

Illustrated in FIG. 1 is a semiconductor substrate 102 in the form of a wafer. The semiconductor substrate 102 includes a plurality of devices 104 formed thereon. The devices 104 may be semiconductor integrated circuit devices such as, memory devices, analog devices, MEMs devices (or portions thereof), logic devices, application specific ICs, microprocessor devices, digital signal processor (DSP) devices, and/or other suitable devices. The device 104 may be an intermediate device fabricated during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, and combinations thereof.

The substrate 102 includes a plurality of defects 106 and 108. The defects 106 and/or 108 may be unwanted effects of the manufacturing processes used to fabricate the devices 104. The defects 106 and/or 108 may affect the performance and/or reliability of the device 104.

The defect 106 is representative of a residue defect. The residue defect 106 may include any undesired material remaining on the substrate 102 during and/or after the fabrication process(es). In an embodiment, the residue defect 106 includes a residue of photosensitive material (e.g., photoresist) remaining on the substrate 102 after the photosensitive material has been developed and/or stripped.

The defect 108 is representative of a damage defect. The damage defect 108 may include any portion of the substrate 102 (including the layers/features formed thereon) that has been damaged by the fabrication processes. In an embodiment, the damage defect 108 includes damage to a gate dielectric layer disposed on the substrate 102. In an embodiment, the damage defect 108 is damage to an oxide layer (e.g., gate oxide).

The inventors have recognized that rinsing the substrate 102 with de-ionized water (DI water) may contribute to and/or cause the damage defect 108. This may be on account of the charging effects of DI water introduced, for example, in a rinse after development of a photosensitive layer.

The inventors have also recognized that rinsing the substrate 102 with water including carbon dioxide, or $CO_2$ water (e.g., de-ionized water having $CO_2$ added, for example, by bubbling $CO_2$ into the water) may release a charged caused by DI water rinsing and/or decrease an accumulation charge as compared to DI water rinsing. This reduction of charge may reduce the damage defects such as the damage defect 108. The lower the $CO_2$ water resistivity, the higher the acidity (e.g., lower the pH). But as a trade-off, the inventors have recognized that the lower resistivity may increase the residue defects such as, the residue defects 106. Thus, the inventors have recognized that while DI water is well-suited for removal of residue defects 106, $CO_2$ water is well-suited for reducing the charge of a substrate and the resultant damage defects 108.

Figure 2:
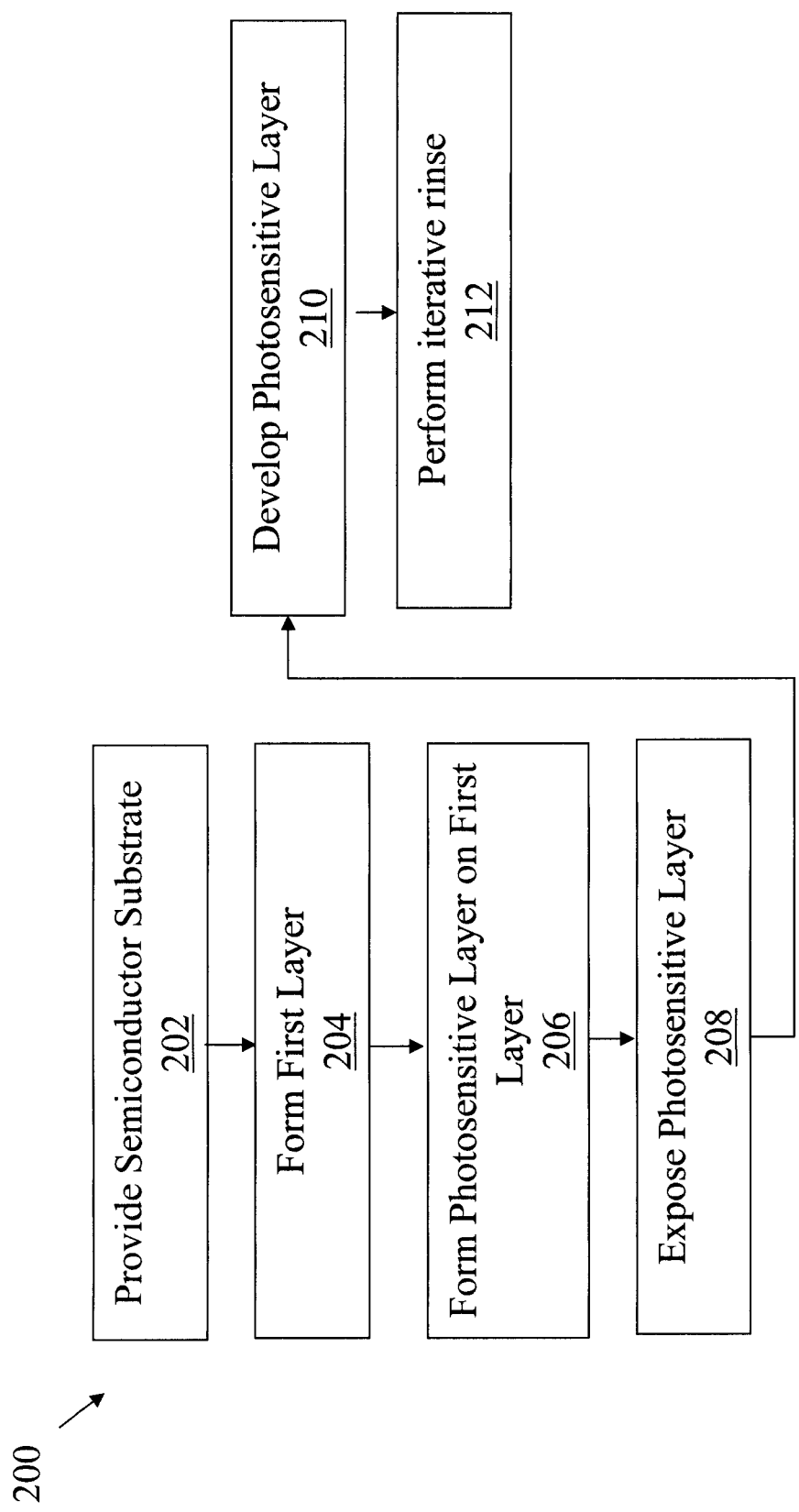
FIG. 2 is a flow chart illustrating an embodiment of a method of fabricating a semiconductor device or portion thereof.

Referring now to FIG. 2, illustrated is a method 200 of semiconductor fabrication, which includes an iterative rinse process performed according to aspects of the present disclosure. The method 200 is exemplary only, and one would recognize that the rinse process may be used at any and/or numerous points in a fabrication process.

The method 200 begins at block 202 where a semiconductor substrate is provided. The semiconductor substrate may have one or more layers (e.g., insulating layers, conductive layers, etc) formed thereon. The semiconductor substrate may include silicon. Alternatively, the substrate includes germanium, silicon germanium or other proper semiconductor materials. The semiconductor substrate may also include isolation structures, active regions, various doped regions (e.g., n-wells and p-wells) formed in various active regions, gate structures or portions thereof, associated source/drain regions, and/or other suitable features.

The method 200 then proceeds to block 204 where a first layer is formed. In an embodiment, the first layer is a gate dielectric layer. In an embodiment, the layer includes an oxide (e.g., a gate oxide). For example, the first layer may include silicon dioxide. Other exemplary materials include, but are not limited to, including metal oxides, metal nitrides, metal silicates, transition metal-oxides, transition metal-nitrides, transition metal-silicates, oxynitrides of metals, metal aluminates, zirconium silicate, zirconium aluminate, combinations thereof, or other suitable compositions. Example suitable high-k dielectrics include hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), combinations thereof, and/or other suitable materials. Alternatively, the high-k dielectric layer may include other high-k dielectrics such as LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, $(Ba,Sr)TiO_3$ (BST), $Al_2O_3$, $Si_3N_4$, and/or other suitable materials.

The method 200 then proceeds to block 206 where a photosensitive layer is formed on the first layer. The photosensitive layer may be formed using a spin-on coating process. The photosensitive may be a negative or a positive type photoresist of any suitable composition. The photosensitive layer may be soft baked after its deposition.

The method 200 then proceeds to block 208 where an exposure process is performed on the photosensitive layer. The exposure process patterns the photosensitive layer. The exposure process includes introducing a radiation beam to the substrate. The radiation beam may be ultraviolet and/or can be extended to include other radiation beams such as ion beam, x-ray, extreme ultraviolet, deep ultraviolet, and other proper radiation energy. The exposure process may be part of an immersion lithography process, electron-beam writing, ion-beam writing, maskless photolithography, molecular imprint, and/or other suitable patterning processes. A post-exposure bake (PEB) may be performed to allow the exposed photoresist polymers to cleave.

The method 200 then proceeds to block 210 where the exposed photosensitive layer is developed (e.g., a developer is applied to the patterned resist to remove the soluble portions of the layer). The substrate including the cleaved polymer photoresist may be transferred to a developing chamber to remove portions of the photosensitive layer (e.g., the exposed resist) that are soluble to an aqueous developer. In an embodiment, the developer is tetra-methyl ammonium hydroxide (TMAH). However, other compositions suitable compositions now known or later developed are also within the scope of the disclosure. A surfactant may also be included. The surfactant may selected from surfactants such as, 3M Novec fluid HFE-7000, HFE-7100, HFE-7200, HFE-7500, HFE-71IPA. 3M Fluorinert FC-72, FC-84, FC-77, FC-3255, FC-3283, FC-40, FC-43, FC-70. 3M Novec 4200, 3M Novec 4300, 3M FC-4432. 3M FC-4430, 3M FC-4434 and/or other surfactants known in the art. The developer may be applied by a puddling process, immersion, spray, and/or other suitable methods.

The exposure and development of the photosensitive layer patterns the photosensitive layer. The patterned photosensitive layer may expose portions of the first layer, and mask other portions of the first layer.

The method 200 then proceeds to block 212 where an iterative rinse is performed. In an embodiment, the iterative rinse is performed in-situ with the development process, described above with reference to block 210. In other words, the substrate is loaded in a chamber where it is exposed to a developer and subsequently to a rinse solution in a cleaning process before being removed from the chamber. The development and rinsing processes may be performed in a development tool. The development tool may be a typical development tool that has been modified and/or other configured to perform the iterative rinse cleaning process (e.g., include a $CO_2$ bubbler). In other embodiments, the iterative rinse is performed in a separate tool. The separate tool may include a $CO_2$ bubbler for introducing a selected amount of $CO_2$ to de-ionized water. The tool may be configured to introduce $CO_2$ water in its vapor phase to the substrate.

The iterative rinse process includes a plurality of rinse processes. In an embodiment, the iterative rinse process includes a plurality of rinse processes, each process including a $CO_2$ water rinse solution. (It is noted that the term solution as used herein does not necessitate a homogeneous composition, but merely a mixture of different elements.) In an embodiment, the iterative rinse process includes a plurality of $CO_2$ water rinses each having a different $CO_2$ water resistivity. Each of the plurality of $CO_2$ water rinses may have a constant resistivity at a duration of greater than approximately 0.1 seconds. The $CO_2$ water resistivity (or $CO_2$ resistivity) may be measured in Ohms (e.g., Ohm-cm or mega (M) Ohm cm). In a further embodiment, the iterative rinse process includes a plurality of $CO_2$ water rinses, where each successive rinse has a decreased $CO_2$ resistivity and/or pH value from the prior performed rinse process. The resistivity and/or pH may be monitored by suitable sensors. In an embodiment, the sensor provides real-time data. The resistivity and/or pH value of the rinse may be measured at an inlet to the rinse chamber, e.g., prior to contacting the substrate.

In embodiments of the iterative rinse, one or more rinses of de-ionized water (e.g., that do not include $CO_2$) may be performed in addition to the plurality of rinses with controlled $CO_2$ resistivity.

An exemplary $CO_2$ resistivity of a rinse process is between approximately 0.1 M-Ohms·cm and approximately 0.6 M-Ohms-cm. An exemplary pH value of a rinse process is between approximately 4 and approximately 7. These process parameters are exemplary only and not intended to be limiting.

Embodiments of iterative rinse processes are described below with reference to FIGS. 3 and 4, and may be substantially similar to the reiterative rinse process of block 212. Following the reiterative rinse process of block 212, the substrate may be dried, for example, using a spin-dry process. In some embodiment, a hard bake process may be performed after the rinse process. The method 200 may then proceed to subsequent steps in semiconductor fabrication.

Figure 3:
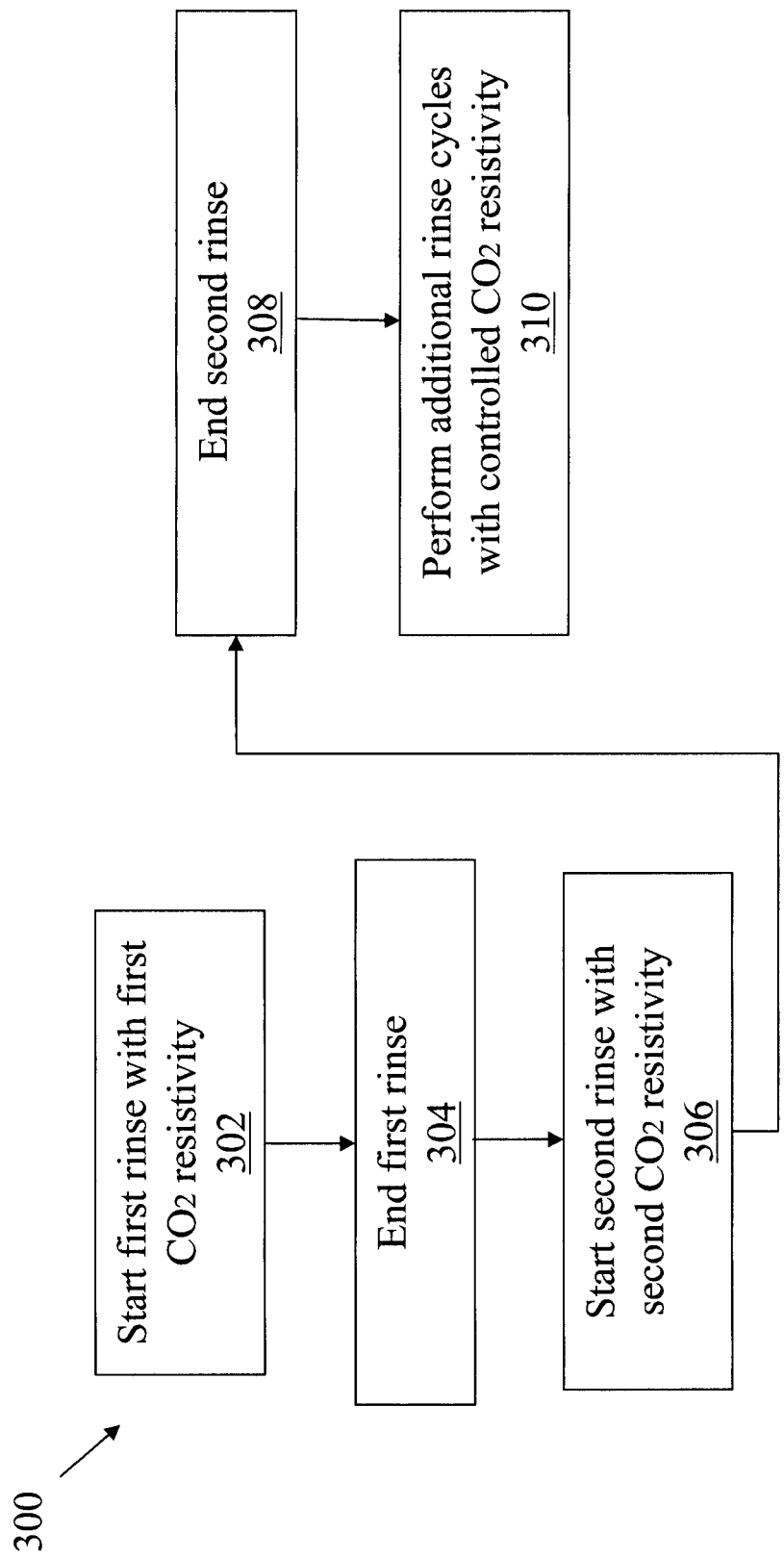
FIG. 3 is a flow chart illustrating an embodiment of a method of performing an iterative rinse, according to one or more aspects of the present disclosure.

Referring now to FIG. 3, illustrated is a method 300 of an embodiment of an iterative rinse process. The method 300 begins at block 302 where a first rinse process is started. The first rinse process includes $CO_2$ water having a first $CO_2$ resistivity. The $CO_2$ resistivity of the rinse solution/mixture of $CO_2$ and de-ionized water prior to introduction to the substrate as measured in Ohms. A substrate is introduced to $CO_2$ water by vapor exposure, immersion, spray rinse, and/or other suitable methods. Example process conditions include, for example, a first rinse having a resistivity between approximately 0.1 and 0.6 M Ohm cm. In an embodiment, the resistivity is approximately 0.45 M Ohms·cm. In an embodiment, the first rinse is performed at a temperature of approximately 15 and approximately 30 degrees. The time of the first rinse may be greater than 0.1 seconds. In an embodiment, the time of the first rinse is approximately 16 seconds (e.g., at a particular resistivity). In an embodiment, the time of the first rinse is between approximately 0.1 seconds and 60 seconds (e.g., at the specified resistivity). In an embodiment, the flowrate of the $CO_2$ water is between approximately 800 cc/min and approximately 1200 cc/min. The method 300 then proceeds to block 304 where the first rinse is terminated.

The method 300 then proceeds to block 306 where a second rinse process of the iterative rinse is started. The second rinse process includes $CO_2$ water having a second $CO_2$ resistivity. The second $CO_2$ resistivity may be lower than the resistivity of the first rinse, described above with reference to block 302. The resistivity may be altered (e.g., lowered) by changing the amount of $CO_2$ that is added to DI-water to form the $CO_2$ water mixture used in the rinse process(es). In an embodiment, the $CO_2$ is bubbled into DI-water. In an embodiment, the flowrate of the bubbler is adjusted to adjust resistivity. In an embodiment, a sensor is provided which indicates a measurement of at least one of resistivity or pH of the rinse (e.g., $CO_2$ water).

The second rinse process may be performed in the same chamber as the first rinse process. In an embodiment, the second rinse process is performed immediately subsequent to the first rinse process (e.g., without a substantially break in time). For example, the first rinse with the first $CO_2$ resistivity may be stopped, and the second rinse immediately started. Alternatively, the composition of $CO_2$ may be altered to provide the second $CO_2$ resistivity without a stop in the DI-water flow and thus, immediately starting the second rinse process.

Example process conditions include, for example, a second rinse having a resistivity between approximately 0.1 and less than approximately 0.6 M Ohm cm. The second rinse resistivity may be lower than the first rinse resistivity. In an embodiment, the second rinse is performed at a temperature of approximately 15 and approximately 30 degrees. The time of the second rinse may be greater than 0.1 seconds. In an embodiment, the time of the second rinse is approximately 16 seconds (e.g., at a particular resistivity). In an embodiment, the time of the second rinse is between approximately 0.1 seconds and 60 seconds (e.g., at the specified resistivity). In an embodiment, the flowrate of the $CO_2$ water is between approximately 800 cc/min and approximately 1200 cc/min.

The $CO_2$ resistivities provided in the first and/or second rinse may be determined based on the product type, the technology node, a defect count determined by experimental data or prediction, and/or other suitable metrics. The provided $CO_2$ resistivit(ies) may be determined using experimental data, which may include defect counts (e.g., residue defects and damage defects, as described above with reference to FIG. 1).

The method 300 then proceeds to block 308 where the second rinse process of the iterative rinse process of the method 300 is terminated.

The method 300 then proceeds to block 310 where additional rinse processes or cycles are performed. The additional rinse cycles may be substantially similar to the first and/or second rinse described above. The additional rinse cycles may also have controlled $CO_2$ resistivity values. Any number of additional rinse cycles may be performed. In an embodiment, at least 10 rinse cycles are performed. In an embodiment, at least 20 rinse cycles are performed. In an embodiment, each additional rinse cycle includes a decreased $CO_2$ resistivity (e.g., decreased pH) from the previously performed rinse cycle. The number of rinse cycles may be determined by the number of defects (e.g., residue and/or damage defects) that are desired. For example, the number of rinse processes performed in the iterative rinse may be determinative of a number of defects attributed to residual material (e.g., photosensitive material) that remain on the substrate. The pH value, or $CO_2$ resistance, of the rinse processes of the iterative rinse may be determinative of the release of charging of the substrate and therefore, the damage defects.

Figure 4:
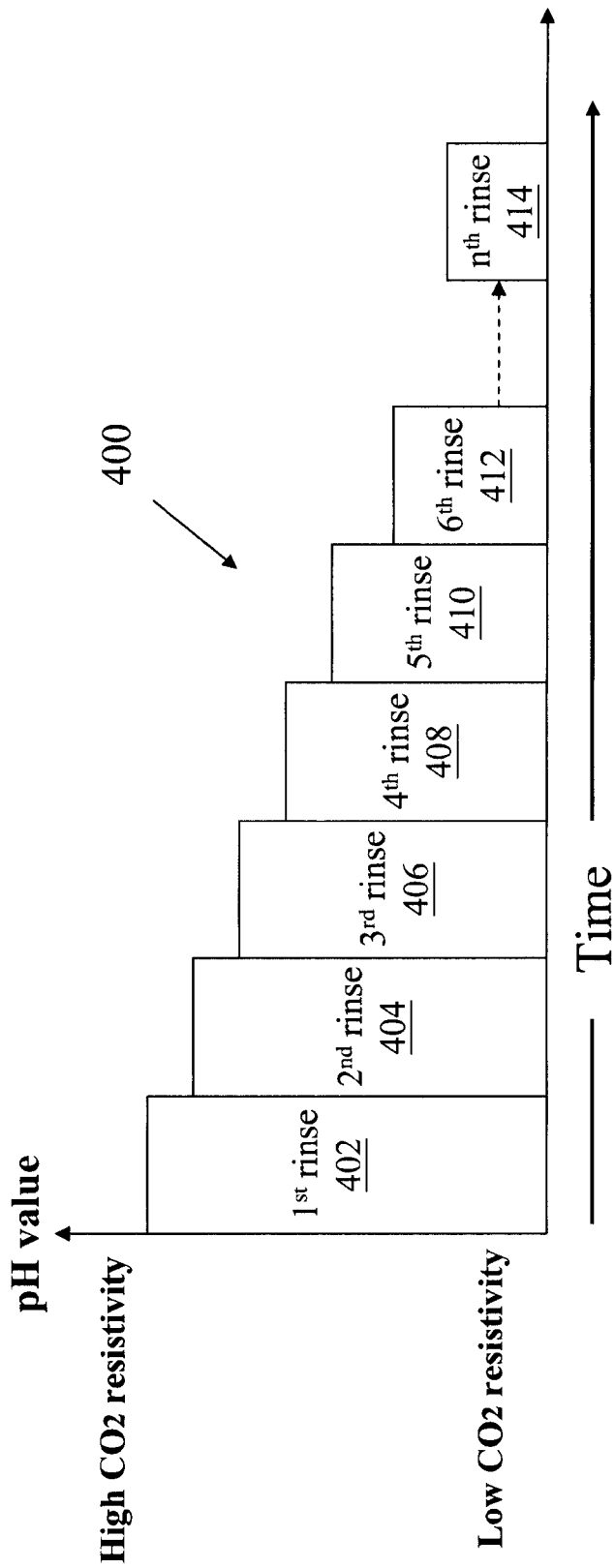
FIG. 4 is a graphical representation of an embodiment of an iterative rinse, according to one or more aspects of the present disclosure.

Referring now to FIG. 4, illustrates is a graphical representative of an embodiment of an iterative rinse 400. The iterative rinse 400 may be substantially similar to the iterative rinse of block 212 of the method 200 and/or the method 300, described above with reference to FIGS. 2 and 3 respectively. The graphical representation includes a horizontal axis showing a progression of time; a vertical axis shows a pH value and $CO_2$ resistivity of the rinse processes of the iterative rinse. It is noted that increasing pH value corresponds to an increasing $CO_2$ resistivity.

The iterative rinse 400 includes a plurality of rinse processes 402, 404, 406, 408, 410, 412, and 414. As illustrated, the first rinse 402 includes $CO_2$ water having a higher resistivity than the second rinse 404; the second rinse 404 includes $CO_2$ water having a higher resistivity than the third rinse 406; the third rinse 406 includes $CO_2$ water having a higher resistivity than the fourth rinse 408; the fourth rinse 408 includes $CO_2$ water having a higher resistivity than the fifth rinse 410; the fifth rinse 410 includes $CO_2$ water having a higher resistivity than the sixth rinse 412. The iterative rinse 400 includes any number of rinse processes as indicated by the nth rinse 414. In an embodiment, n is equal to 20.

Thus, provided are method of rinsing a semiconductor substrate which, in embodiments, allows for reduced defects such as remaining residue on a substrate and damage defects. Some examples of the present disclosure may reduce amount of the photosensitive material that remains on a substrate after a rinse process. Embodiments of the method(s) described herein may also reduce damage defects including gate dielectric damage. For example, oxide damage may be reduced for a gate oxide layer. Some embodiments may provide both improvements in damage defects, such as oxide damage, as well as remaining defects, such as residual photosensitive material.

According to the present disclosure, an embodiment of a method of semiconductor fabrication is provided. The method includes providing a semiconductor substrate having a surface. A first rinse of the surface of the semiconductor substrate with de-ionized (DI) water and carbon dioxide ($CO_2$) is performed. The first rinse has a first resistivity. A second rinse of the surface of the semiconductor substrate with DI water and $CO_2$ is performed. The second rinse has a second resistivity lower than the first resistivity.

In an embodiment of the method, a third rinse of the surface of the semiconductor substrate with DI water and $CO_2$ is performed. The third rinse has a third resistivity lower than the second resistivity. The second rinse may immediately follow the first rinse.

In an embodiment of the method, a photosensitive layer is also formed on the substrate. The photosensitive layer is exposed and then, developed. The developing of the photosensitive layer provides the surface of the semiconductor substrate, which is cleaned by the first and second rinse described above. In an embodiment, the surface includes a gate dielectric (e.g., upon which a patterned photosensitive layer is formed). In a further embodiment, the developing of the photosensitive layer and the first rinse are performed in-situ.

In another embodiment of the present disclosure, a method is described that includes providing a semiconductor substrate having a first layer and patterning a photosensitive layer overlying the first layer. After patterning, the semiconductor substrate including the first layer is rinsed. The rinse includes providing a first resistivity of $CO_2$ water and subsequently providing a second resistivity of $CO_2$ water to the semiconductor substrate. The second resistivity of $CO_2$ water may be less than the first resistivity.

In a further embodiment, the $CO_2$ water is in its vapor phase. In an embodiment, the providing the first resistivity of $CO_2$ water includes using a bubbler to mix a first amount of $CO_2$ with de-ionized water. The second resistivity of $CO_2$ water may be provided by adjusting the bubbler to mix a second amount of $CO_2$ with de-ionized water.

In an embodiment, at least one of resistivity and pH of the $CO_2$ water is monitored during the rinse process. The monitoring may be performed by a suitable sensor.

In yet another embodiment, an iterative rinse is performed on a semiconductor substrate. The iterative rinse includes a plurality of rinse cycles. Each of the plurality of rinse cycles may have a different resistivity. The plurality of rinse cycles may include different amounts of carbon dioxide dissolved in de-ionized water. In an embodiment, the de-ionized water is in a vapor phase.

Although illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A semiconductor fabrication method, comprising:
   providing a semiconductor substrate having a surface;
   performing a first rinse of the surface of the semiconductor substrate with de-ionized (DI) water and carbon dioxide ($CO_2$), wherein the first rinse has a first resistivity; and
   performing a second rinse of the surface of the semiconductor substrate with DI water and $CO_2$, wherein the second rinse has a second resistivity lower than the first resistivity.

2. The semiconductor fabrication method of claim 1, further comprising:
   performing a third rinse of the surface of the semiconductor substrate with DI water and $CO_2$, wherein the third rinse has a third resistivity lower than the second resistivity.

3. The semiconductor fabrication method of claim 1, wherein the second rinse immediately follows the first rinse.

4. The semiconductor fabrication method of claim 1, further comprising:
   forming a photosensitive layer on the substrate;
   exposing the photosensitive layer; and
   developing the exposed photosensitive layer, wherein the developing the photosensitive layer provides the surface of the semiconductor substrate.

5. The semiconductor fabrication method of claim 4, wherein the developing and the first rinse are performed in-situ.

6. The semiconductor fabrication method of claim 1, wherein the surface includes a gate dielectric material.

7. A method, comprising:
   providing a semiconductor substrate having a first layer;
   patterning a photosensitive layer overlying the first layer; and
   rinsing the semiconductor substrate including the first layer and the patterned photosensitive layer with $CO_2$ water, wherein the $CO_2$ water is de-ionized water (DI) with carbon dioxide added to the DI water, wherein the rinsing includes providing a first resistivity of $CO_2$ water and subsequently providing a second resistivity of $CO_2$ water to the semiconductor substrate.

8. The method of claim 7, wherein the second resistivity of $CO_2$ water is less than the first resistivity.

9. The method of claim 7, wherein the $CO_2$ water is a vapor.

10. The method of claim 7, wherein the first layer is a gate dielectric.

11. The method of claim 7, wherein the providing a first resistivity of $CO_2$ water is performed for at least 0.1 seconds.

12. The method of claim 7, wherein the providing the first resistivity of $CO_2$ water includes using a bubbler to mix a first amount of $CO_2$ with de-ionized water.

13. The method of claim 12, wherein the providing the second resistivity of $CO_2$ water includes adjusting the bubbler to mix a second amount of $CO_2$ with de-ionized water.

14. The method of claim 7, wherein the rinsing further includes subsequently providing a third resistivity of $CO_2$ water to the semiconductor substrate, the third resistivity being less than the second resistivity.

15. The method of claim 7, further comprising:
    monitoring at least one of resistivity and pH of the $CO_2$ water during the rinse process.

16. A method of semiconductor fabrication, comprising:
    performing an iterative rinse on a semiconductor substrate, wherein the iterative rinse includes a plurality of successive rinse cycles, wherein each of the successive rinse cycles has a lower resistivity and each of the rinse cycles include a different amount of carbon dioxide dissolved in de-ionized water.

17. The method of claim 16, wherein the de-ionized water is in a vapor phase.

18. The method of claim 16, wherein the plurality of rinse cycles includes at least 10 cycles.

19. The method of claim 16, wherein the iterative rinse is performed after developing a photosensitive layer on the semiconductor substrate.

* * * * *